United States Patent
Kim et al.

(10) Patent No.: US 10,762,933 B2
(45) Date of Patent: Sep. 1, 2020

(54) SEMICONDUCTOR DEVICE

(71) Applicant: SK hynix Inc., Icheon-si, Gyeonggi-do (KR)

(72) Inventors: Hong Gyeom Kim, Icheon-si (KR); Dae Ho Ra, Seoul (KR); Byung Kuk Yoon, Hwaseong-si (KR); Min Sik Han, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/198,460

(22) Filed: Nov. 21, 2018

(65) Prior Publication Data

US 2019/0325925 A1 Oct. 24, 2019

(30) Foreign Application Priority Data

Apr. 23, 2018 (KR) .......................... 10-2018-0047008

(51) Int. Cl.
*G11C 7/10* (2006.01)
*G11C 7/22* (2006.01)

(52) U.S. Cl.
CPC ............ *G11C 7/106* (2013.01); *G11C 7/1066* (2013.01); *G11C 7/1069* (2013.01); *G11C 7/222* (2013.01)

(58) Field of Classification Search
CPC ..... G11C 7/106; G11C 7/1066; G11C 7/1069; G11C 7/222
USPC ...................................................... 365/189.05
See application file for complete search history.

(56) References Cited

U.S. PATENT DOCUMENTS

| 6,446,180 | B2 | 9/2002 | Li et al. | |
|---|---|---|---|---|
| 6,772,312 | B2* | 8/2004 | Mes ...................... | G11C 7/1039 365/194 |
| 9,450,587 | B2* | 9/2016 | Ku .......................... | G01R 31/30 |
| 10,372,157 | B2* | 8/2019 | Lee ...................... | G11C 7/1039 |
| 10,402,202 | B2* | 9/2019 | Hong ..................... | G11C 7/106 |
| 2005/0185484 | A1* | 8/2005 | Jang ...................... | G11C 7/1051 365/201 |
| 2006/0092772 | A1* | 5/2006 | Tsai ....................... | G11B 20/10 369/30.01 |
| 2006/0104126 | A1* | 5/2006 | Park ...................... | G11C 7/1051 365/189.05 |

(Continued)

FOREIGN PATENT DOCUMENTS

KR 1020150014611 A 2/2015

*Primary Examiner* — Viet Q Nguyen
(74) *Attorney, Agent, or Firm* — William Park & Associates Ltd.

(57) ABSTRACT

A semiconductor device includes a latch control circuit configured to generate a latch input signal, which is enabled in response to a latency signal, and configured to generate a latch output signal, which is enabled in response to an order control signal. The semiconductor device also includes a pipe latch circuit configured to latch input data in response to a pipe input signal and configured to output the latched input data as latch data in response to a pipe output signal. The semiconductor device additionally includes a data output circuit configured to latch the latch data in response to the latch input signal and configured to output the latched latch data as output data in response to the latch output signal, wherein the output data is outputted by performing an alignment operation for the latch data in response to the latch output signal.

25 Claims, 12 Drawing Sheets

(56) References Cited

U.S. PATENT DOCUMENTS

| | | | | |
|---|---|---|---|---|
| 2007/0070677 A1* | 3/2007 | Shin | ................. | G11C 7/1039 |
| | | | | 365/78 |
| 2008/0074936 A1* | 3/2008 | Kim | ................. | G11C 7/1039 |
| | | | | 365/189.15 |
| 2010/0056066 A1* | 3/2010 | Shin | ................. | G11C 7/1051 |
| | | | | 455/68 |
| 2010/0302873 A1* | 12/2010 | Lee | ................. | G11C 7/1045 |
| | | | | 365/189.05 |
| 2011/0216606 A1* | 9/2011 | Kim | ............. | G11C 7/00 |
| | | | | 365/189.05 |
| 2012/0087201 A1* | 4/2012 | Moon | ............. | G11C 7/1039 |
| | | | | 365/233.18 |
| 2012/0170382 A1* | 7/2012 | Do | ................. | G11C 29/1201 |
| | | | | 365/189.05 |
| 2015/0302915 A1* | 10/2015 | Park | ............... | G11C 11/4093 |
| | | | | 365/189.05 |
| 2019/0311750 A1* | 10/2019 | Han | .............. | G11C 7/106 |

* cited by examiner

SEMICONDUCTOR DEVICE

CROSS-REFERENCE TO RELATED APPLICATION

The present application claims priority under 35 U.S.C. § 119(a) to Korean Patent Application No. 10-2018-0047008, filed on Apr. 23, 2018, in the Korean Intellectual Property Office, which is incorporated herein by reference in its entirety.

BACKGROUND

1. Technical Field

Embodiments of the present disclosure relate to a semiconductor device which outputs data by using pipe latches.

2. Related Art

In general, a semiconductor memory device including a DDR SDRAM (double data rate synchronous DRAM) performs data read and write operations in response to commands inputted from an external chipset. In order for the semiconductor memory device to perform such read and write operations, various circuits should be provided therein. Among them, there is a pipe latch circuit for efficiently controlling a large amount of data. Generally, a pipe latch circuit as a circuit configured to store and output each of a plurality of input signals at desired timings is included in a semiconductor device. The pipe latch circuit may increase signal transmission and reception capacity between internal circuits or between an external device of the semiconductor device and an internal circuit of the semiconductor device. The background art of the present disclosure is disclosed in Korean Unexamined Patent Publication No. 10-2015-0014611.

SUMMARY

In an embodiment, a semiconductor device may include a latch control circuit configured to generate a latch input signal, which is enabled in response to a latency signal, and configured to generate a latch output signal, which is enabled in response to an order control signal. The semiconductor device may also include a pipe latch circuit configured to latch input data in response to a pipe input signal and configured to output the latched input data as latch data in response to a pipe output signal. The semiconductor device may additionally include a data output circuit configured to latch the latch data in response to the latch input signal and configured to output the latched latch data as output data in response to the latch output signal, wherein the output data is outputted by performing an alignment operation for the latch data in response to the latch output signal.

In an embodiment, a semiconductor device may include a pipe control circuit configured to generate first to fourth pipe input signals, which are sequentially enabled in response to a read signal, and configured to generate first to fourth pipe output signals, which are sequentially enabled in synchronization with an internal clock in response to a latency signal. The semiconductor device may also include a pipe latch circuit configured to latch first to fourth input data in response to the first to fourth pipe input signals, and configured to output the latched first to fourth input data as first to fourth latch data in response to the first to fourth pipe output signals. The semiconductor device may additionally include a data output circuit configured to latch the first to fourth latch data in response to a latch input signal, and configured to output the latched first to fourth latch data as first to fourth output data in response to first to fourth latch output signals.

DETAILED DESCRIPTION

A semiconductor device is described below with reference to the accompanying drawings through presented embodiments. Various embodiments are directed to a semiconductor device which couples pipe latches in series and aligns and outputs data by using the pipe latches. According to some embodiments, pipe latches may be coupled in series, and data may be aligned and outputted by using the pipe latches coupled in series.

Figure 1:
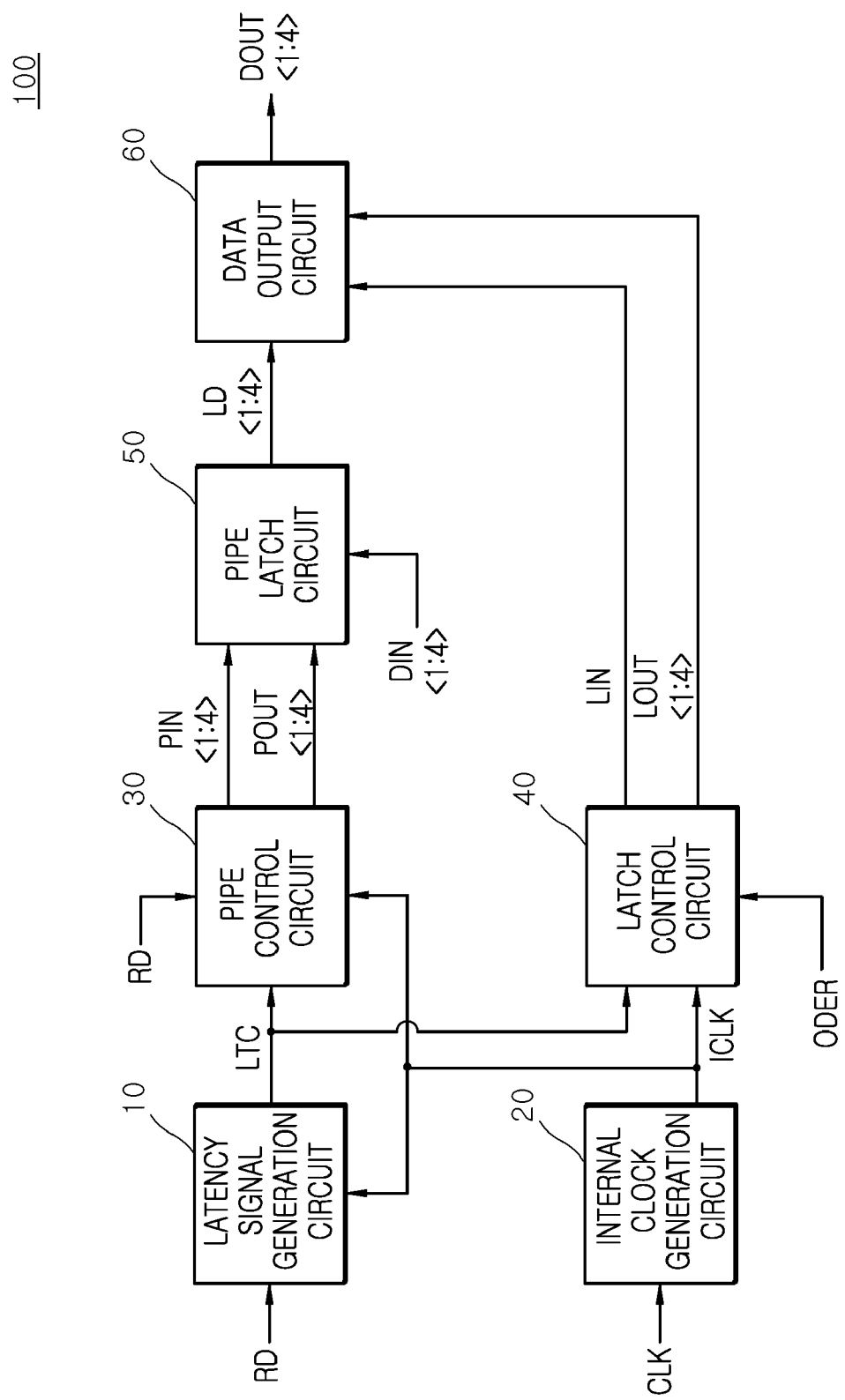
FIG. 1 shows a block diagram illustrating a configuration of a semiconductor device in accordance with an embodiment.

As shown in FIG. 1, a semiconductor device 100 in accordance with an embodiment may include a latency signal generation circuit 10, an internal clock generation circuit 20, a pipe control circuit 30, a latch control circuit 40, a pipe latch circuit 50, and a data output circuit 60.

The latency signal generation circuit 10 may generate a latency signal LTC which is enabled in a read operation. The latency signal generation circuit 10 may generate the latency signal LTC which is enabled in response to a read signal RD. The latency signal generation circuit 10 may generate the latency signal LTC, which includes a pulse generated for a predetermined time period after a latency period in response to the read signal RD. The word "predetermined" as used herein with respect to a parameter, such as a predetermined time period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The internal clock generation circuit 20 may generate an internal clock ICLK in response to an external clock CLK. The internal clock generation circuit 20 may generate the internal clock ICLK by adjusting the phase of the external clock CLK inputted from outside the semiconductor device 100. The internal clock generation circuit 20 may generate the internal clock ICLK by adjusting the phase of the external clock CLK in conformity with the frequency of the semiconductor device 100. The internal clock generation circuit 20 may be implemented by a general DLL (delay-locked loop) circuit or PLL (phase-locked loop) circuit.

The pipe control circuit 30 may generate first to fourth pipe input signals PIN<1:4>, which are sequentially enabled in the read operation. The pipe control circuit 30 may generate the first to fourth pipe input signals PIN<1:4> which are sequentially enabled in response to the read signal RD. The pipe control circuit 30 may generate first to fourth pipe output signals POUT<1:4>, which are sequentially enabled in the read operation. The pipe control circuit 30 may generate the first to fourth pipe output signals POUT<1:4> which are sequentially enabled in synchronization with the internal clock ICLK in response to the latency signal LTC.

The latch control circuit 40 may generate a latch input signal LIN, which is enabled in response to the latency signal LTC. The latch control circuit 40 may generate first to fourth latch output signals LOUT<1:4>, which are enabled in response to an order control signal ODER. The latch control circuit 40 may generate the first to fourth latch output signals LOUT<1:4>, which are enabled in synchronization with the internal clock ICLK, depending on the logic level of an order control signal ODER. The order control signal ODER may be set as a signal for setting a first alignment operation and a second alignment operation for data. The first alignment operation may be set as an operation for generating first to fourth output data DOUT<1:4> without changing the order of first to fourth input data DIN<1:4>. The second alignment operation may be set as an operation for generating the first to fourth output data DOUT<1:4> by changing the order of the first to fourth input data DIN<1:4>. The order control signal ODER may be set as a signal which level-transitions from a logic high level to a logic low level in the first alignment operation. The order control signal ODER may be set as a signal which level-transitions from the logic low level to the logic high level in the second alignment operation.

The pipe latch circuit 50 may latch the first to fourth input data DIN<1:4> in response to the first to fourth pipe input signals PIN<1:4>. The pipe latch circuit 50 may latch the first to fourth input data DIN<1:4> in the case where the first to fourth pipe input signals PIN<1:4> are enabled. The pipe latch circuit 50 may output the latched first to fourth input data DIN<1:4> as first to fourth latch data LD<1:4> in response to the first to fourth pipe output signals POUT<1:4>. The pipe latch circuit 50 may output the latched first to fourth input data DIN<1:4> as the first to fourth latch data LD<1:4> in the case where the first to fourth pipe output signals POUT<1:4> are enabled. The pipe latch circuit 50 may be implemented by using pipe latches.

The data output circuit 60 may latch the first to fourth latch data LD<1:4> in response to the latch input signal LIN. The data output circuit 60 may latch the first to fourth latch data LD<1:4> at a time when the latch input signal LIN is enabled. The data output circuit 60 may output the latched first to fourth latch data LD<1:4> as the first to fourth output data DOUT<1:4> in response to the first to fourth latch output signals LOUT<1:4>. The data output circuit 60 may output the latched first to fourth latch data LD<1:4> as the first to fourth output data DOUT<1:4> at times when the first to fourth latch output signals LOUT<1:4> are enabled. The data output circuit 60 may output the first to fourth output data DOUT<1:4> by performing an alignment operation for the first to fourth latch data LD<1:4> depending on the logic levels of the first to fourth latch output signals LOUT<1:4>. The data output circuit 60 may be implemented by using pipe latches.

Figure 2:
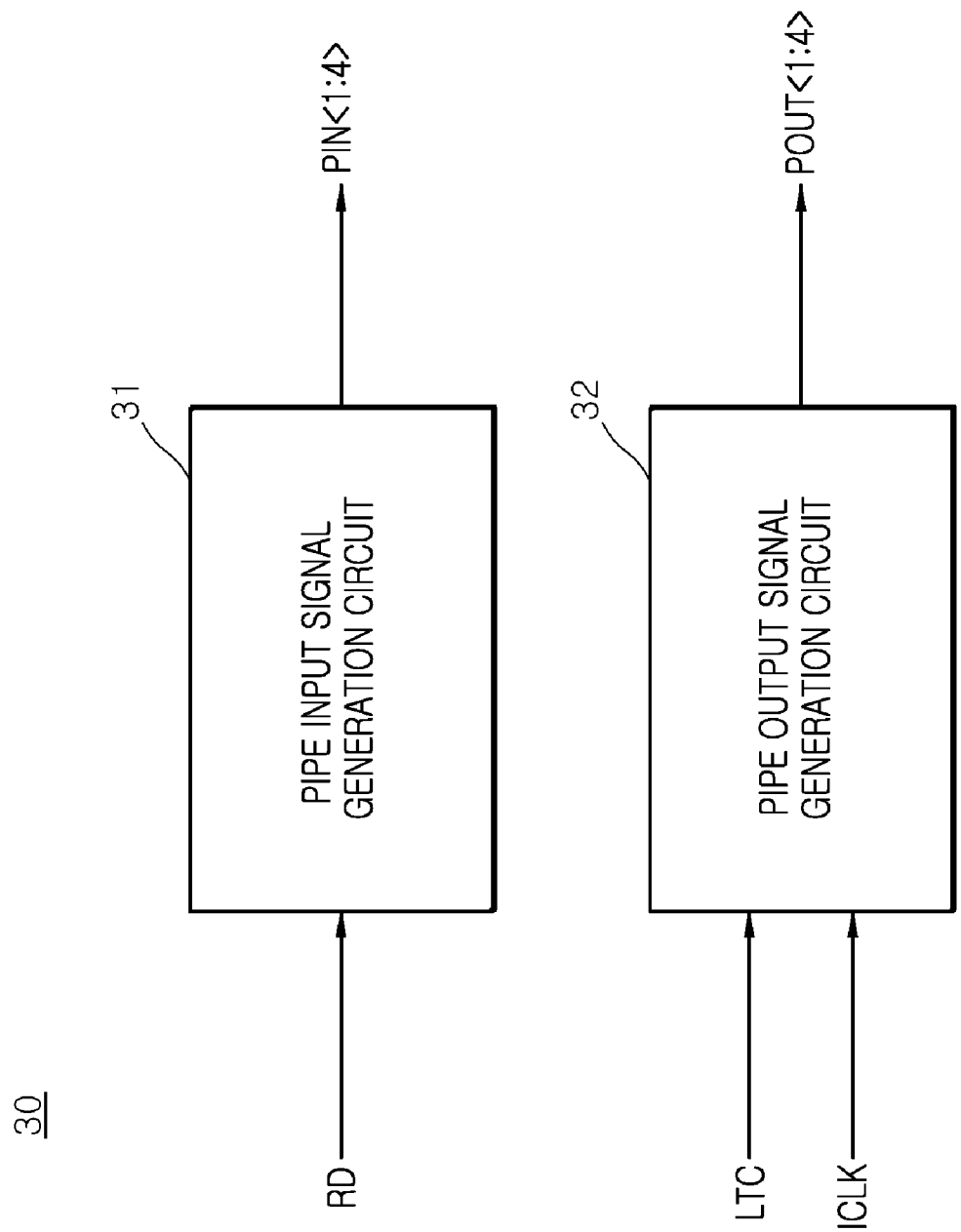
FIG. 2 shows a block diagram illustrating a configuration of the pipe control circuit included in the semiconductor device shown in FIG. 1.

Referring to FIG. 2, the pipe control circuit 30 may include a pipe input signal generation circuit 31 and a pipe output signal generation circuit 32.

The pipe input signal generation circuit 31 may generate the first to fourth pipe input signals PIN<1:4>, which are sequentially enabled in the read operation. The pipe input signal generation circuit 31 may generate the first to fourth pipe input signals PIN<1:4>, which are sequentially enabled in response to the read signal RD.

The pipe output signal generation circuit 32 may initialize the first to fourth pipe output signals POUT<1:4> to a first set combination. The pipe output signal generation circuit 32 may generate the first to fourth pipe output signals POUT<1:4> which are sequentially enabled in the read operation. The pipe output signal generation circuit 32 may generate the first to fourth pipe output signals POUT<1:4> which are sequentially enabled in synchronization with the internal clock ICLK in response to the latency signal LTC. The first set combination of the first to fourth pipe output signals POUT<1:4> which are initialized corresponds to the case where the first pipe output signal POUT<1> is set to a logic high level and the second to fourth pipe output signals POUT<2:4> are set to logic low levels. The first to fourth pipe output signals POUT<1:4> may be initialized during a power-up period in which the semiconductor device 100 starts to operate or through a separate operation.

Figure 3:
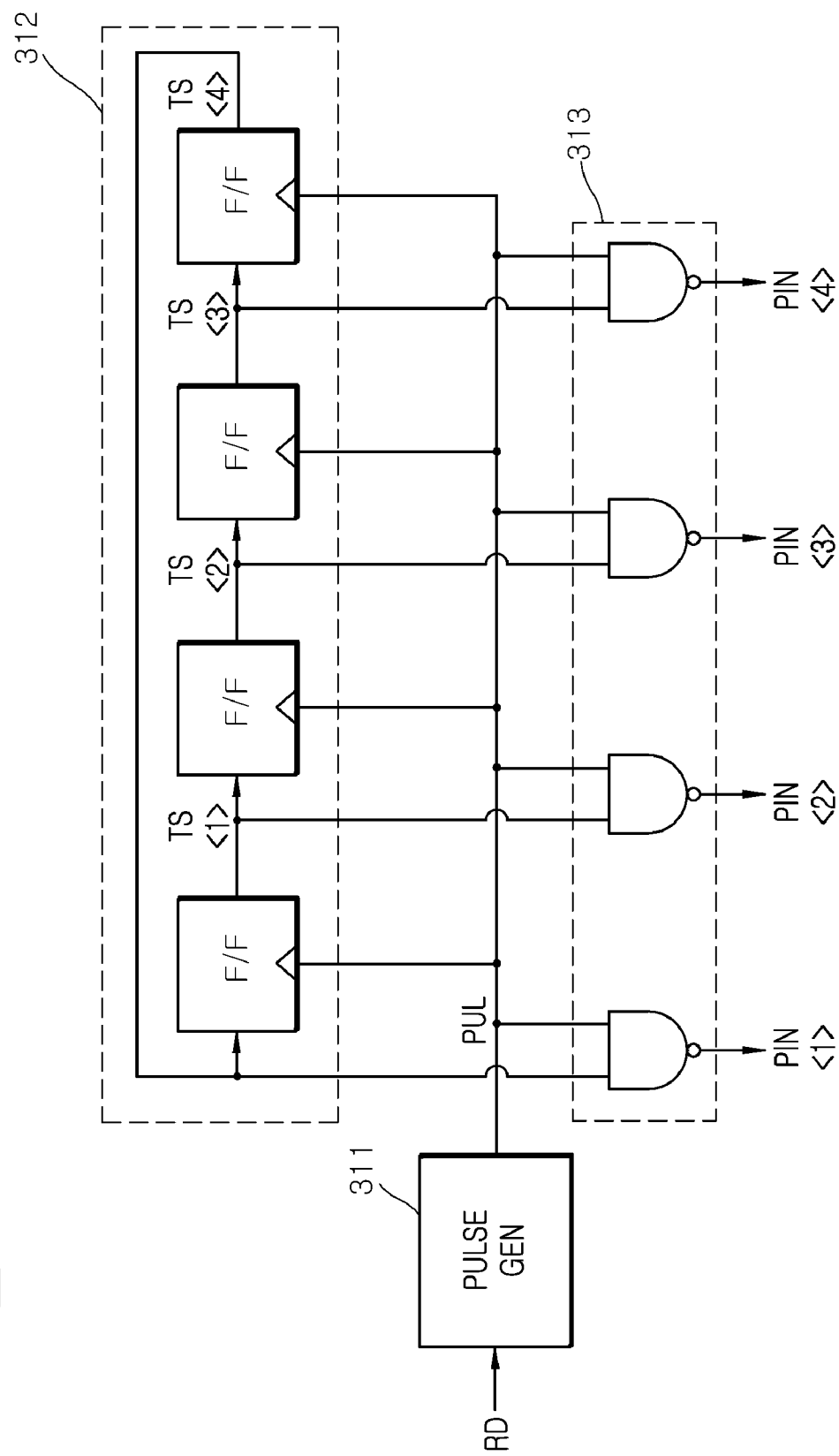
FIG. 3 shows a circuit diagram illustrating a configuration of the pipe input signal generation circuit included in the pipe control circuit shown in FIG. 2.

Referring to FIG. 3, the pipe input signal generation circuit 31 may include a pulse signal generation circuit 311, a transfer signal generation circuit 312, and a first logic circuit 313.

The pulse signal generation circuit 311 may generate a pulse signal PUL, which is enabled in response to the read signal RD. The pulse signal generation circuit 311 may generate the pulse signal PUL, which includes a pulse generated in the case where the read signal RD is inputted. The pulse signal generation circuit 311 may generate the pulse signal PUL, which includes a pulse cyclically generated in the case where the read signal RD is inputted. The pulse signal generation circuit 311 may generate the pulse signal PUL, which includes a pulse of a logic high level in the case where the read signal RD is inputted at a logic high level.

The transfer signal generation circuit 312 may initialize first to fourth transfer signals TS<1:4> to a second set combination. The transfer signal generation circuit 312 may generate the first to fourth transfer signals TS<1:4>, which are sequentially enabled in response to the pulse signal PUL. The second set combination of the first to fourth transfer signals TS<1:4> which are initialized corresponds to the case where the first to third transfer signals TS<1:3> are set to logic low levels and the fourth transfer signal TS<4> is set to a logic high level. The transfer signal generation circuit 312 may be implemented by a shift register, which is implemented by a plurality of flip-flops. The first to fourth transfer signals TS<1:4> may be initialized during the power-up period in which the semiconductor device 100 starts to operate or through a separate operation.

The first logic circuit 313 may generate the first to fourth pipe input signals PIN<1:4>, which are initialized in response to the pulse signal PUL. The first logic circuit 313 may generate the first to fourth pipe input signals PIN<1:4> from the first to fourth transfer signals TS<1:4> in response to the pulse signal PUL. The first logic circuit 313 may generate the first to fourth pipe input signals PIN<1:4> by inverting and buffering the first to fourth transfer signals TS<1:4> in the case where the pulse signal PUL is inputted at the logic high level. The first to fourth pipe input signals PIN<1:4> which are initialized correspond to the case where all of the first to fourth pipe input signals PIN<1:4> are generated at logic high levels.

Figure 4:
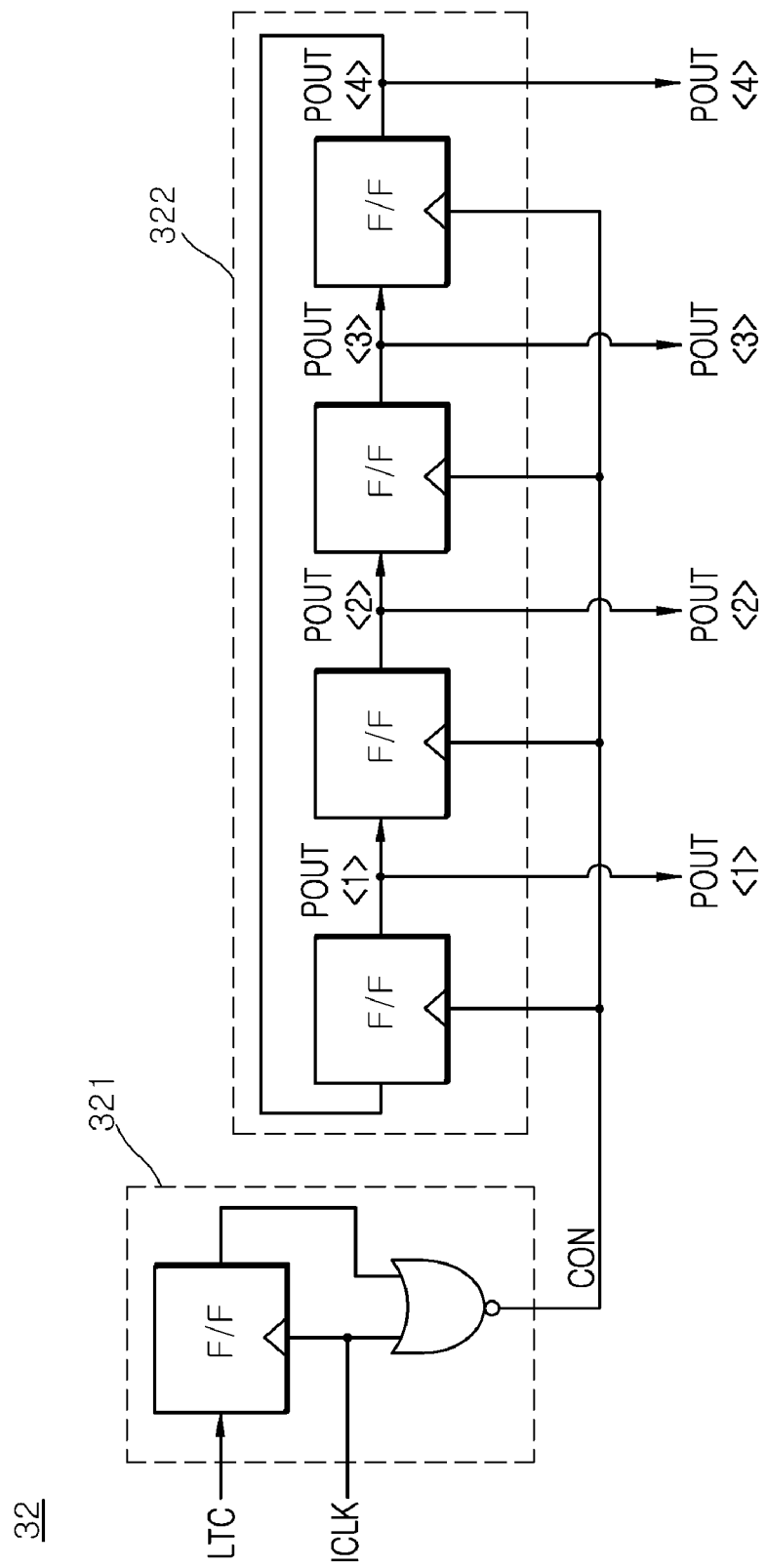
FIG. 4 shows a circuit diagram illustrating a configuration of the pipe output signal generation circuit included in the pipe control circuit shown in FIG. 2.

Referring to FIG. 4, the pipe output signal generation circuit 32 may include a control signal generation circuit 321 and a first signal transfer circuit 322.

The control signal generation circuit 321 may generate a control signal CON from the latency signal LTC in synchronization with the internal clock ICLK. The control signal generation circuit 321 may latch the latency signal LTC in synchronization with the internal clock ICLK. The control signal generation circuit 321 may latch the latency signal LTC during a period in which the internal clock ICLK has a logic high level. The control signal generation circuit 321 may output the latched latency signal LTC as the control signal CON in synchronization with the internal clock ICLK. The control signal generation circuit 321 may output the latched latency signal LTC as the control signal CON during a period in which the internal clock ICLK has a logic low level.

The first signal transfer circuit 322 may initialize the first to fourth pipe output signals POUT<1:4> to the first set combination. The first signal transfer circuit 322 may generate the first to fourth pipe output signals POUT<1:4>, which are sequentially enabled in response to the control signal CON. The first signal transfer circuit 322 may be implemented by a shift register which is implemented by a plurality of flip-flops.

Figure 5:
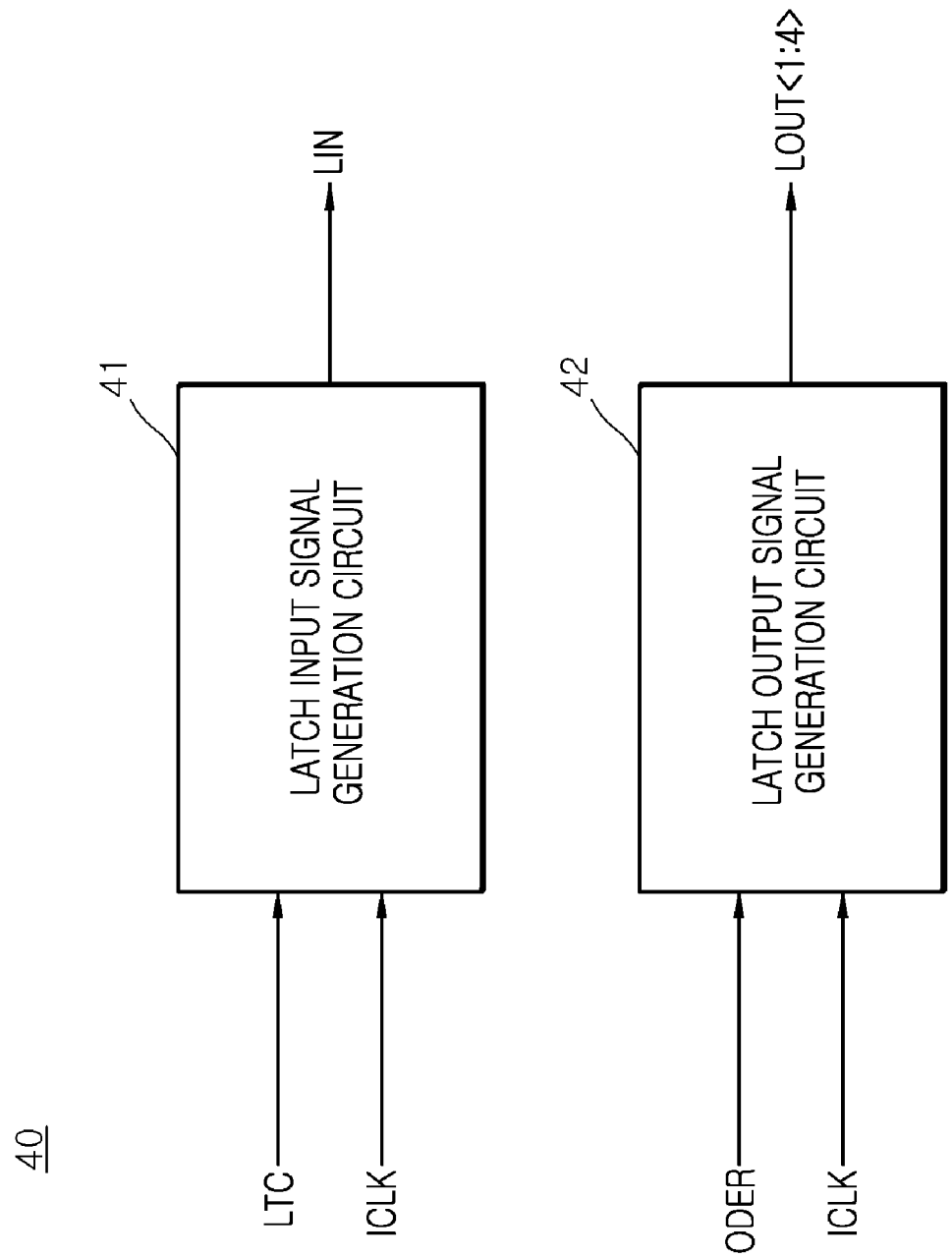
FIG. 5 shows a block diagram illustrating a configuration of the latch control circuit included in the semiconductor device shown in FIG. 1.

Referring to FIG. 5, the latch control circuit 40 may include a latch input signal generation circuit 41 and a latch output signal generation circuit 42.

The latch input signal generation circuit 41 may generate the latch input signal LIN from the latency signal LTC in synchronization with the internal clock ICLK. The latch input signal generation circuit 41 may latch the latency signal LTC in synchronization with the internal clock ICLK. The latch input signal generation circuit 41 may latch the latency signal LTC during a period in which the internal clock ICLK has a logic high level. The latch input signal generation circuit 41 may output the latched latency signal LTC as the latch input signal LIN during a period in which the internal clock ICLK has the logic low level.

The latch output signal generation circuit 42 may generate the first to fourth latch output signals LOUT<1:4>, which are sequentially enabled in synchronization with the internal clock ICLK in response to the order control signal ODER. The latch output signal generation circuit 42 may generate the first to fourth latch output signals LOUT<1:4> which are sequentially enabled in synchronization with the internal clock ICLK depending on the logic level of the order control signal ODER. The latch output signal generation circuit 42 may generate the first and second latch output signals LOUT<1:2> which are sequentially enabled in synchronization with the internal clock ICLK during a period in which the order control signal ODER has the logic high level. The latch output signal generation circuit 42 may generate the third and fourth latch output signals LOUT<3:4> which are sequentially enabled in synchronization with the internal clock ICLK during a period in which the order control signal ODER has the logic low level.

Figure 6:
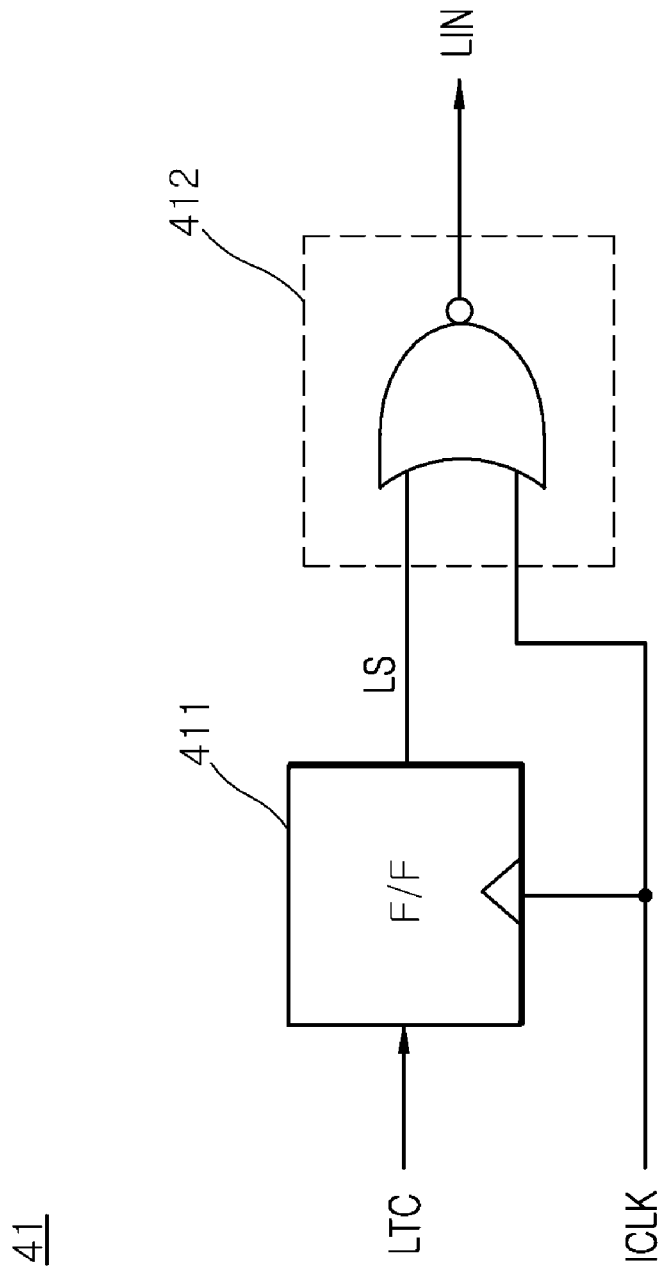
FIG. 6 shows a circuit diagram illustrating a configuration of the latch input signal generation circuit included in the latch control circuit shown in FIG. 5.

Referring to FIG. 6, the latch input signal generation circuit 41 may include a latch signal generation circuit 411 and a second logic circuit 412.

The latch signal generation circuit 411 may latch the latency signal LTC in synchronization with the internal clock ICLK. The latch signal generation circuit 411 may output the latched latency signal LTC as a latch signal LS in synchronization with the internal clock ICLK. The latch signal generation circuit 411 may be implemented by a general flip-flop.

The second logic circuit 412 may generate the latch input signal LIN from the latch signal LS in response to the internal clock ICLK. The second logic circuit 412 may generate the latch input signal LIN by inverting and buffering the latch signal LS in the case where the internal clock ICLK has the logic low level.

Figure 7:
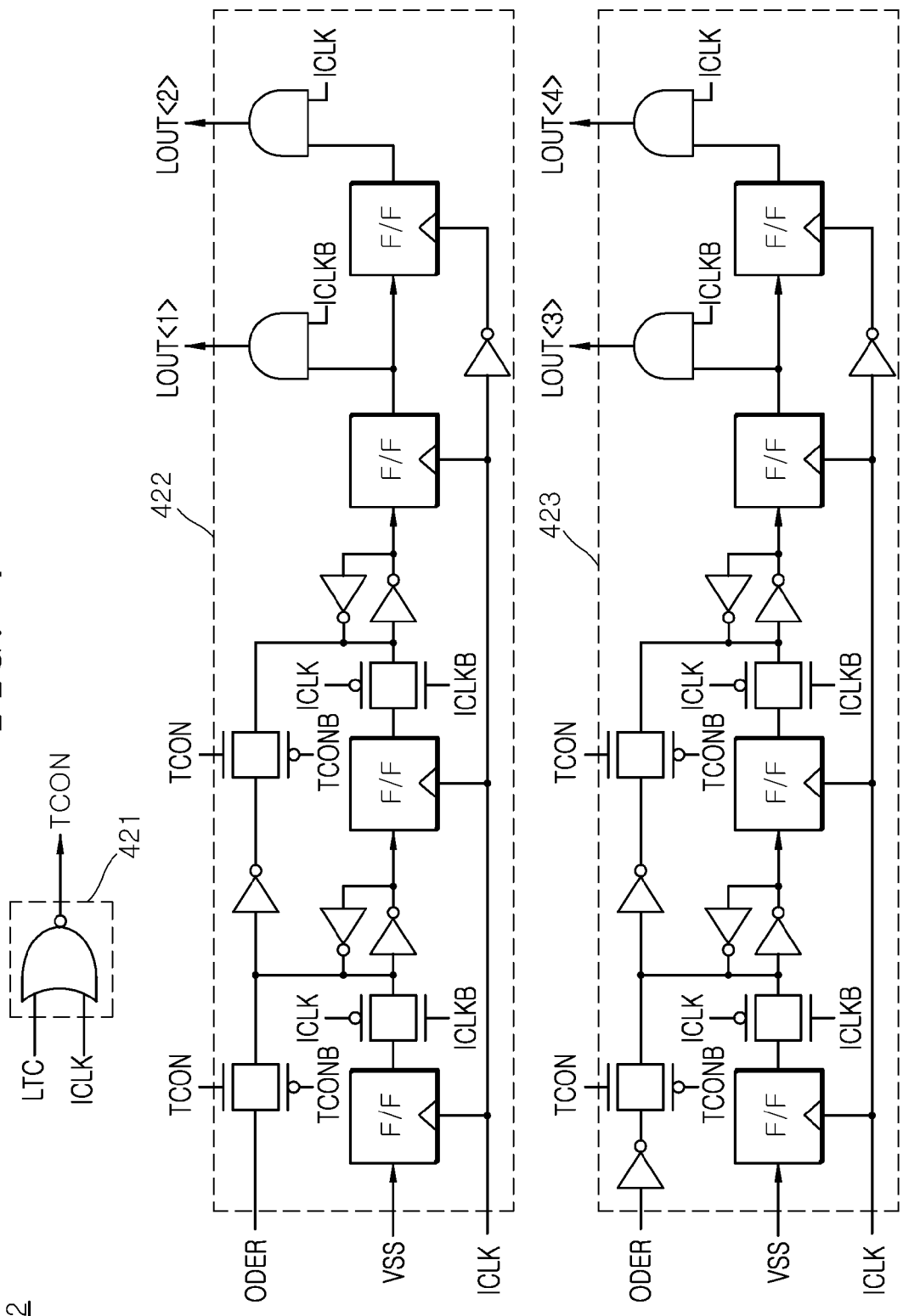
FIG. 7 shows a circuit diagram illustrating a configuration of the latch output signal generation circuit included in the latch control circuit shown in FIG. 5.

Referring to FIG. 7, the latch output signal generation circuit 42 may include a transfer control signal generation circuit 421, a second signal transfer circuit 422, and a third signal transfer circuit 423.

The transfer control signal generation circuit 421 may generate a transfer control signal TCON, which is enabled in response to the internal clock ICLK and the latency signal LTC. The transfer control signal generation circuit 421 may generate the transfer control signal TCON from the latency signal LTC in synchronization with the internal clock ICLK. The transfer control signal generation circuit 421 may generate the transfer control signal TCON by inverting and buffering the internal clock ICLK during a period in which the latency signal LTC has a logic low level. The inverted signal of the transfer control signal TCON is indicated by "TCONB."

The second signal transfer circuit 422 may generate the first and second latch output signals LOUT<1:2> which are initialized to the voltage level of a ground voltage VSS in synchronization with the internal clock ICLK. The second signal transfer circuit 422 may generate the first and second latch output signals LOUT<1:2>, which are sequentially enabled in synchronization with the internal clock ICLK depending on the logic level of the order control signal ODER in response to the transfer control signal TCON. The second signal transfer circuit 422 may receive the order control signal ODER in the case where the transfer control signal TCON is enabled to a logic high level. The second signal transfer circuit 422 may generate the first latch output signal LOUT<1>, which is enabled to a logic high level in the case where the transfer control signal TCON is enabled to the logic high level and the order control signal ODER has the logic high level during the logic high level period of an inverted internal clock ICLKB. The second signal transfer circuit 422 may generate the second latch output signal LOUT<2>, which is enabled to a logic high level in the case where the transfer control signal TCON is enabled to the logic high level and the order control signal ODER has the logic high level during the logic high level period of the internal clock ICLK. The second signal transfer circuit 422 may generate the first and second latch output signals LOUT<1:2>, which are disabled to logic low levels in the case where the transfer control signal TCON is enabled to the logic high level and the order control signal ODER has the logic low level. The inverted internal clock ICLKB may be set as the inverted signal of the internal clock ICLK.

The third signal transfer circuit 423 may generate the third and fourth latch output signals LOUT<3:4>, which are initialized to the level of the ground voltage VSS in synchronization with the internal clock ICLK. The third signal transfer circuit 423 may generate the third and fourth latch output signals LOUT<3:4>, which are sequentially enabled in synchronization with the internal clock ICLK depending on the logic level of the order control signal ODER in response to the transfer control signal TCON. The third signal transfer circuit 423 may receive the order control signal ODER in the case where the transfer control signal TCON is enabled to the logic high level. The third signal transfer circuit 423 may generate the third latch output signal LOUT<3>, which is enabled to a logic high level in the case where the transfer control signal TCON is enabled to the logic high level and the order control signal ODER has the logic low level during the logic high level period of the inverted internal clock ICLKB. The third signal transfer circuit 423 may generate the fourth latch output signal LOUT<4>, which is enabled to a logic high level in the case where the transfer control signal TCON is enabled to the logic high level and the order control signal ODER has the logic low level during the logic high level period of the internal clock ICLK. The third signal transfer circuit 423 may generate the third and fourth latch output signals LOUT<3:4>, which are disabled to logic low levels in the case where the transfer control signal TCON is enabled to the logic high level and the order control signal ODER has the logic high level.

Figure 8:
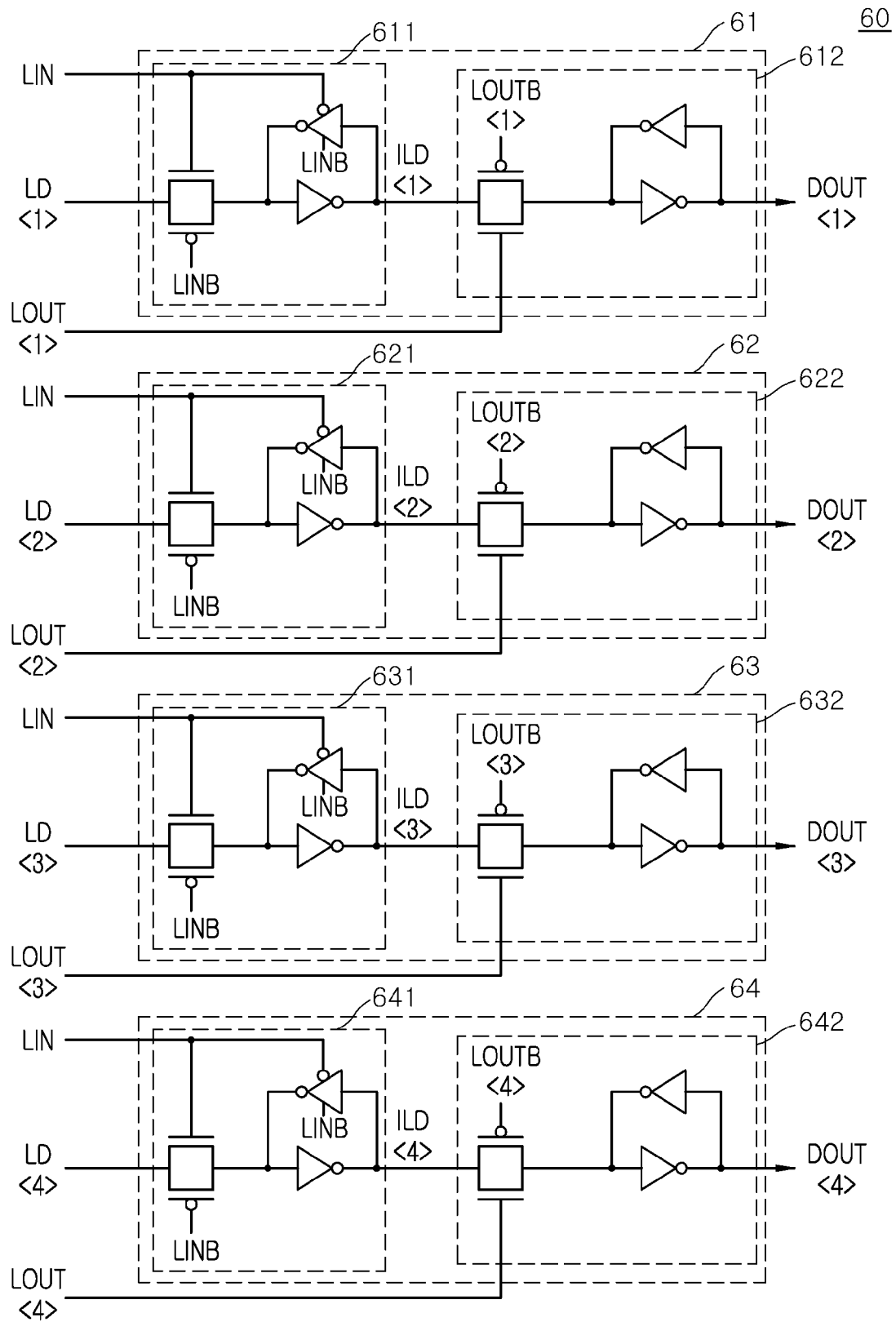
FIG. 8 shows a circuit diagram illustrating a configuration of the data output circuit included in the semiconductor device shown in FIG. 1.

Referring to FIG. 8, the data output circuit 60 may include a first data output circuit 61, a second data output circuit 62, a third data output circuit 63, and a fourth data output circuit 64.

The first data output circuit 61 may latch the first latch data LD<1> in response to the latch input signal LIN. The first data output circuit 61 may output the latched first latch data LD<1> as the first output data DOUT<1> in response to the first latch output signal LOUT<1>.

In detail, the first data output circuit 61 may include a first latch circuit 611 and a second latch circuit 612. The first latch circuit 611 may receive the first latch data LD<1> in the case where the latch input signal LIN has a logic high level. The first latch circuit 611 may generate first internal latch data ILD<1> by inverting and buffering the first latch data LD<1> in the case where the latch input signal LIN has the logic high level. The first latch circuit 611 may latch the first internal latch data ILD<1> in the case where the latch input signal LIN has a logic low level. The second latch circuit 612 may output the first output data DOUT<1> by inverting and buffering the first internal latch data ILD<1> in the case where the first latch output signal LOUT<1> has the logic high level. The second latch circuit 612 may latch the first output data DOUT<1>. The inverted signal of the latch input signal LIN is indicated by "LINB." The inverted signals of the latch output signals LOUT<1:4> are indicated by "LOUTB<1:4>."

The second data output circuit 62 may latch the second latch data LD<2> in response to the latch input signal LIN. The second data output circuit 62 may output the latched second latch data LD<2> as the second output data DOUT<2> in response to the second latch output signal LOUT<2>.

In detail, the second data output circuit 62 may include a third latch circuit 621 and a fourth latch circuit 622. The third latch circuit 621 may receive the second latch data LD<2> in the case where the latch input signal LIN has the logic high level. The third latch circuit 621 may generate second internal latch data ILD<2> by inverting and buffering the second latch data LD<2> in the case where the latch input signal LIN has the logic high level. The third latch circuit 621 may latch the second internal latch data ILD<2> in the case where the latch input signal LIN has the logic low level. The fourth latch circuit 622 may output the second output data DOUT<2> by inverting and buffering the second internal latch data ILD<2> in the case where the second latch output signal LOUT<2> has the logic high level. The fourth latch circuit 622 may latch the second output data DOUT<2>.

The third data output circuit 63 may latch the third latch data LD<3> in response to the latch input signal LIN. The third data output circuit 63 may output the latched third latch data LD<3> as the third output data DOUT<3> in response to the third latch output signal LOUT<3>.

In detail, the third data output circuit 63 may include a fifth latch circuit 631 and a sixth latch circuit 632. The fifth latch circuit 631 may receive the third latch data LD<3> in the case where the latch input signal LIN has the logic high level. The fifth latch circuit 631 may generate third internal latch data ILD<3> by inverting and buffering the third latch data LD<3> in the case where the latch input signal LIN has the logic high level. The fifth latch circuit 631 may latch the third internal latch data ILD<3> in the case where the latch input signal LIN has the logic low level. The sixth latch circuit 632 may output the third output data DOUT<3> by inverting and buffering the third internal latch data ILD<3> in the case where the third latch output signal LOUT<3> has the logic high level. The sixth latch circuit 632 may latch the third output data DOUT<3>.

The fourth data output circuit 64 may latch the fourth latch data LD<4> in response to the latch input signal LIN. The fourth data output circuit 64 may output the latched fourth latch data LD<4> as the fourth output data DOUT<4> in response to the fourth latch output signal LOUT<4>.

In detail, the fourth data output circuit 64 may include a seventh latch circuit 641 and an eighth latch circuit 642. The seventh latch circuit 641 may receive the fourth latch data LD<4> in the case where the latch input signal LIN has the logic high level. The seventh latch circuit 641 may generate fourth internal latch data ILD<4> by inverting and buffering the fourth latch data LD<4> in the case where the latch input signal LIN has the logic high level. The seventh latch circuit 641 may latch the fourth internal latch data ILD<4> in the case where the latch input signal LIN has the logic low level. The eighth latch circuit 642 may output the fourth output data DOUT<4> by inverting and buffering the fourth internal latch data ILD<4> in the case where the fourth latch output signal LOUT<4> has the logic high level. The eighth latch circuit 642 may latch the fourth output data DOUT<4>.

The operation of the semiconductor device 100 in accordance with an embodiment is described below with reference to FIG. 9. In detail, an operation of generating the first to fourth latch data LD<1:4> by latching the first to fourth pipe input signals PIN<1:4> in a read operation is described below.

At a time T1, the pulse signal generation circuit 311 of the pipe input signal generation circuit 31 generates the pulse signal PUL which includes a pulse having the logic high level, in response to the read signal RD.

The transfer signal generation circuit 312 of the pipe input signal generation circuit 31 generates the first to fourth transfer signals TS<1:4>, which are initialized to the second set combination. The first to third transfer signals TS<1:3> are generated at the logic low level and the fourth transfer signal TS<4> is generated at the logic high level.

The first logic circuit 313 of the pipe input signal generation circuit 31 generates the first pipe input signal PIN<1>, which is enabled to a logic low level, by inverting and buffering the fourth transfer signal TS<4> in response to the pulse signal PUL having the logic high level.

The first signal transfer circuit 322 of the pipe output signal generation circuit 32 generates the first to fourth pipe output signals POUT<1:4>, which are initialized to the first set combination. The first pipe output signal POUT<1> is generated at the logic high level, and the second to fourth pipe output signals POUT<1:4> are generated at the logic low level.

The pipe latch circuit 50 latches the first input data DIN<1> in response to the first pipe input signal PIN<1> having the logic low level. The pipe latch circuit 50 outputs the latched first input data DIN<1> as the first latch data LD<1> in response to the first pipe output signal POUT<1> having the logic high level.

At a time T2, the pulse signal generation circuit 311 of the pipe input signal generation circuit 31 generates the pulse signal PUL which includes a pulse at the logic high level, in response to the read signal RD.

The transfer signal generation circuit 312 of the pipe input signal generation circuit 31 generates the first transfer signal TS<1>, which is enabled to a logic high level, in response to the pulse signal PUL having the logic high level.

The first logic circuit 313 of the pipe input signal generation circuit 31 generates the second pipe input signal PIN<2>, which is enabled to a logic low level, by inverting and buffering the first transfer signal TS<1> in response to the pulse signal PUL having the logic high level.

The pipe latch circuit 50 latches the second input data DIN<2> in response to the second pipe input signal PIN<2> having the logic low level.

At a time T3, the pulse signal generation circuit 311 of the pipe input signal generation circuit 31 generates the pulse signal PUL, which includes a pulse having the logic high level, in response to the read signal RD.

The transfer signal generation circuit 312 of the pipe input signal generation circuit 31 generates the second transfer signal TS<2>, which is enabled to a logic high level, in response to the pulse signal PUL having the logic high level.

The first logic circuit 313 of the pipe input signal generation circuit 31 generates the third pipe input signal PIN<3>, which is enabled to a logic low level, by inverting and buffering the second transfer signal TS<2> in response to the pulse signal PUL having the logic high level.

The pipe latch circuit 50 latches the third input data DIN<3> in response to the third pipe input signal PIN<3> having the logic low level.

At a time T4, the pulse signal generation circuit 311 of the pipe input signal generation circuit 31 generates the pulse signal PUL, which includes a pulse having the logic high level, in response to the read signal RD.

The transfer signal generation circuit 312 of the pipe input signal generation circuit 31 generates the third transfer signal TS<3>, which is enabled to a logic high level, in response to the pulse signal PUL having the logic high level.

The first logic circuit 313 of the pipe input signal generation circuit 31 generates the fourth pipe input signal PIN<4>, which is enabled to a logic low level, by inverting and buffering the third transfer signal TS<3> in response to the pulse signal PUL having the logic high level.

The pipe latch circuit 50 latches the fourth input data DIN<4> in response to the fourth pipe input signal PIN<4> having the logic low level.

At a time T5, the latency signal generation circuit 10 generates the latency signal LTC, which includes a pulse having the logic low level, after a latency period, in response to the read signal RD inputted at the time T1. The latency period is set as a period for data output from the input time of the read signal RD, and the period from the time T1 to the time T5 is set as the latency period.

The control signal generation circuit 321 of the pipe output signal generation circuit 32 latches the latency signal LTC having the logic low level in synchronization with the internal clock ICLK having the logic high level.

At a time T6, the control signal generation circuit 321 of the pipe output signal generation circuit 32 generates the control signal CON having a logic high level by inverting and buffering the latency signal LTC having the logic low level in synchronization with the internal clock ICLK having the logic low level.

The first signal transfer circuit 322 of the pipe output signal generation circuit 32 generates the second pipe output signal POUT<2>, which is enabled to a logic high level, in response to the control signal CON having the logic high level.

The pipe latch circuit 50 outputs the second input data DIN<2> latched in response to the second pipe input signal PIN<2>, as the second latch data LD<2>.

At a time T7, the control signal generation circuit 321 of the pipe output signal generation circuit 32 generates the control signal CON having the logic high level by inverting and buffering the latency signal LTC having the logic low level in synchronization with the internal clock ICLK having the logic low level.

The first signal transfer circuit 322 of the pipe output signal generation circuit 32 generates the third pipe output signal POUT<3>, which is enabled to a logic high level, in response to the control signal CON having the logic high level.

The pipe latch circuit 50 outputs the third input data DIN<3> latched in response to the third pipe input signal PIN<3>, as the third latch data LD<3>.

At a time T8, the control signal generation circuit 321 of the pipe output signal generation circuit 32 generates the control signal CON having the logic high level by inverting and buffering the latency signal LTC having the logic low level in synchronization with the internal clock ICLK having the logic low level.

The first signal transfer circuit 322 of the pipe output signal generation circuit 32 generates the fourth pipe output signal POUT<4>, which is enabled to a logic high level, in response to the control signal CON having the logic high level.

The pipe latch circuit 50 outputs the fourth input data DIN<4> latched in response to the fourth pipe input signal PIN<4>, as the fourth latch data LD<4>.

The operation of the semiconductor device 100 in accordance with an embodiment is described below with reference to FIG. 10. In detail, an operation of generating the first to fourth output data DOUT<1:4> by latching the first to fourth latch data LD<1:4> in a read operation in a first alignment operation is described below.

Figure 9:
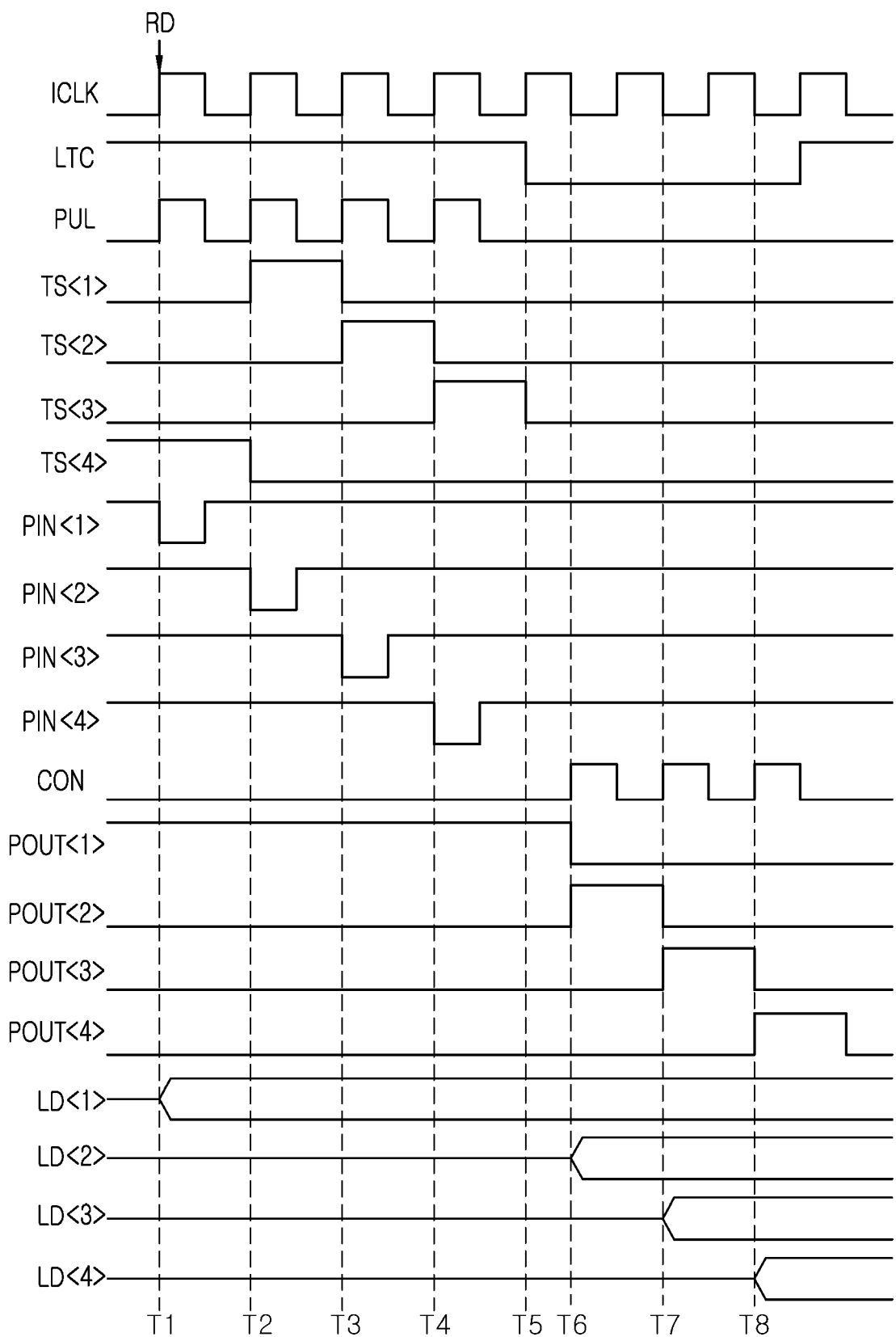
FIGS. 9 to 11 show timing diagrams to assist in the explanation of the operation of the semiconductor device in accordance with the embodiment.
Figure 10:
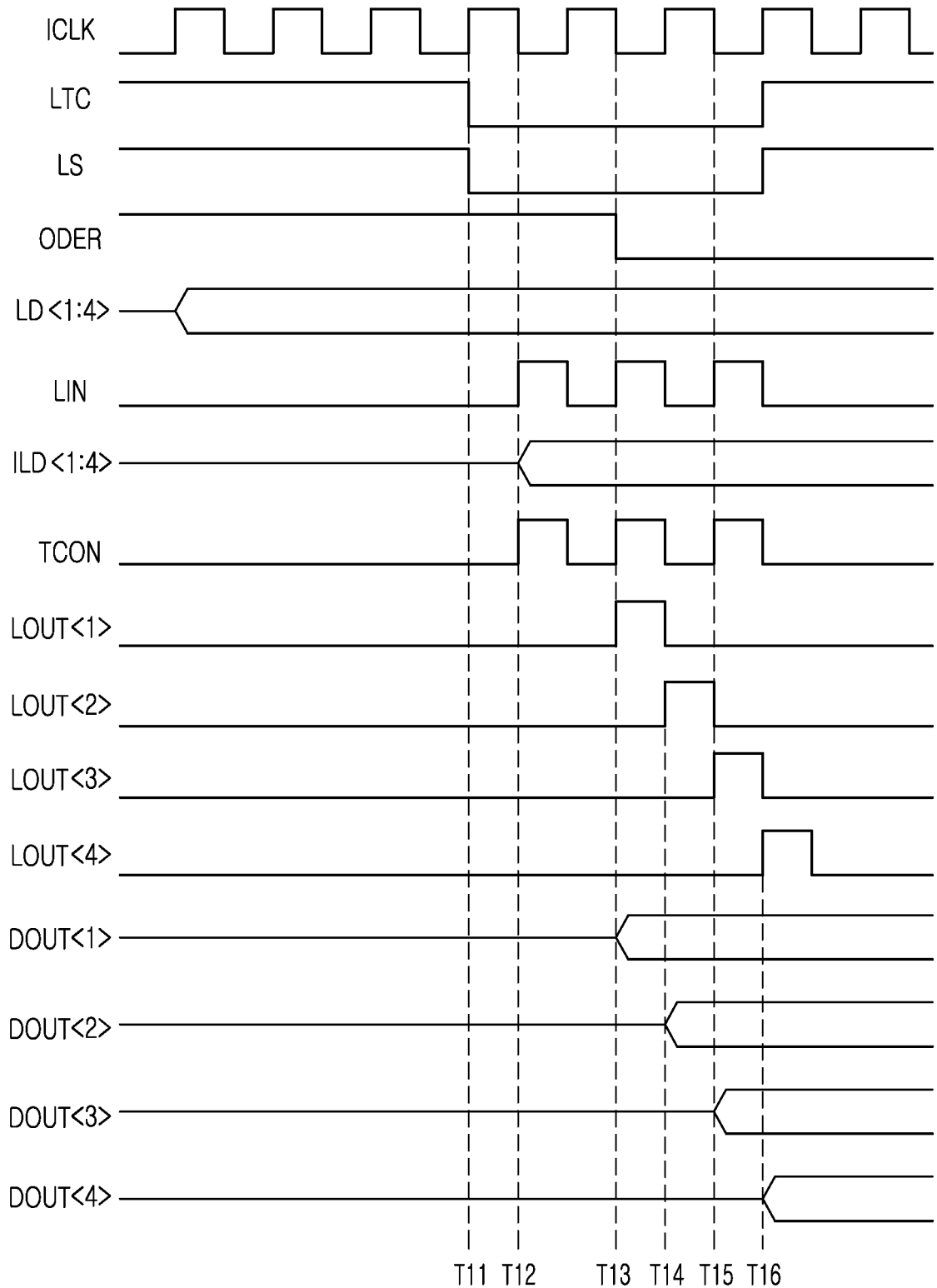

In this case, the read operation shown in FIG. 10 is set as a read operation performed after the read operation shown in FIG. 9 is performed.

At a time T11, the latch signal generation circuit 411 of the latch input signal generation circuit 41 generates the latch signal LS having a logic low level by latching the latency signal LTC in response to the internal clock ICLK having the logic high level.

At a time T12, the second logic circuit 412 of the latch input signal generation circuit 41 generates the latch input signal LIN having the logic high level by inverting and buffering the latch signal LS in response to the internal clock ICLK having the logic low level.

The first latch circuit 611 of the first data output circuit 61 generates the first internal latch data ILD<1> by inverting and buffering the first latch data LD<1> in response to the latch input signal LIN having the logic high level.

The third latch circuit 621 of the second data output circuit 62 generates the second internal latch data ILD<2> by inverting and buffering the second latch data LD<2> in response to the latch input signal LIN having the logic high level.

The fifth latch circuit 631 of the third data output circuit 63 generates the third internal latch data ILD<3> by inverting and buffering the third latch data LD<3> in response to the latch input signal LIN having the logic high level.

The seventh latch circuit 641 of the fourth data output circuit 64 generates the fourth internal latch data ILD<4> by inverting and buffering the fourth latch data LD<4> in response to the latch input signal LIN having the logic high level.

The transfer control signal generation circuit 421 of the latch output signal generation circuit 42 generates the transfer control signal TCON having the logic high level by inverting and buffering the internal clock ICLK in response to the latency signal LTC having the logic low level.

The second signal transfer circuit 422 of the latch output signal generation circuit 42 receives the order control signal ODER having the logic high level in response to the transfer control signal TCON having the logic high level.

At a time T13, the second signal transfer circuit 422 of the latch output signal generation circuit 42 generates the first latch output signal LOUT<1>, which is enabled to the logic high level, in response to the transfer control signal TCON having the logic high level, because the internal clock ICLK has the logic low level and the order control signal ODER inputted at the time T12 has the logic high level.

The second latch circuit 612 of the first data output circuit 61 generates the first output data DOUT<1> by inverting and buffering the first internal latch data ILD<1> in response to the first latch output signal LOUT<1> having the logic high level.

The transfer control signal generation circuit 421 of the latch output signal generation circuit 42 generates the transfer control signal TCON having the logic high level by inverting and buffering the internal clock ICLK in response to the latency signal LTC having the logic low level.

The second signal transfer circuit 422 of the latch output signal generation circuit 42 receives the order control signal ODER having the logic low level in response to the transfer control signal TCON having the logic high level.

At a time T14, the second signal transfer circuit 422 of the latch output signal generation circuit 42 generates the second latch output signal LOUT<2>, which is enabled to the logic high level, during a period in which the internal clock ICLK has the logic high level.

The fourth latch circuit 622 of the second data output circuit 62 generates the second output data DOUT<2> by inverting and buffering the second internal latch data ILD<2> in response to the second latch output signal LOUT<2> having the logic high level.

At a time T15, the third signal transfer circuit 423 of the latch output signal generation circuit 42 generates the third latch output signal LOUT<3>, which is enabled to the logic high level, in response to the transfer control signal TCON having the logic high level, because the internal clock ICLK has the logic low level and the order control signal ODER inputted at the time T13 has the logic low level.

The sixth latch circuit 632 of the third data output circuit 63 generates the third output data DOUT<3> by inverting and buffering the third internal latch data ILD<3> in response to the third latch output signal LOUT<3> having the logic high level.

At a time T16, the third signal transfer circuit 423 of the latch output signal generation circuit 42 generates the fourth latch output signal LOUT<4>, which is enabled to the logic high level, during a period in which the internal clock ICLK has the logic high level.

The eighth latch circuit 642 of the fourth data output circuit 64 generates the fourth output data DOUT<4> by inverting and buffering the fourth internal latch data ILD<4> in response to the fourth latch output signal LOUT<4> having the logic high level.

The operation of the semiconductor device 100 in accordance with an embodiment is described below with reference to FIG. 11. In detail, an operation of generating the first to fourth output data DOUT<1:4> by latching the first to fourth latch data LD<1:4> in a read operation in a second alignment operation is described below.

Figure 11:
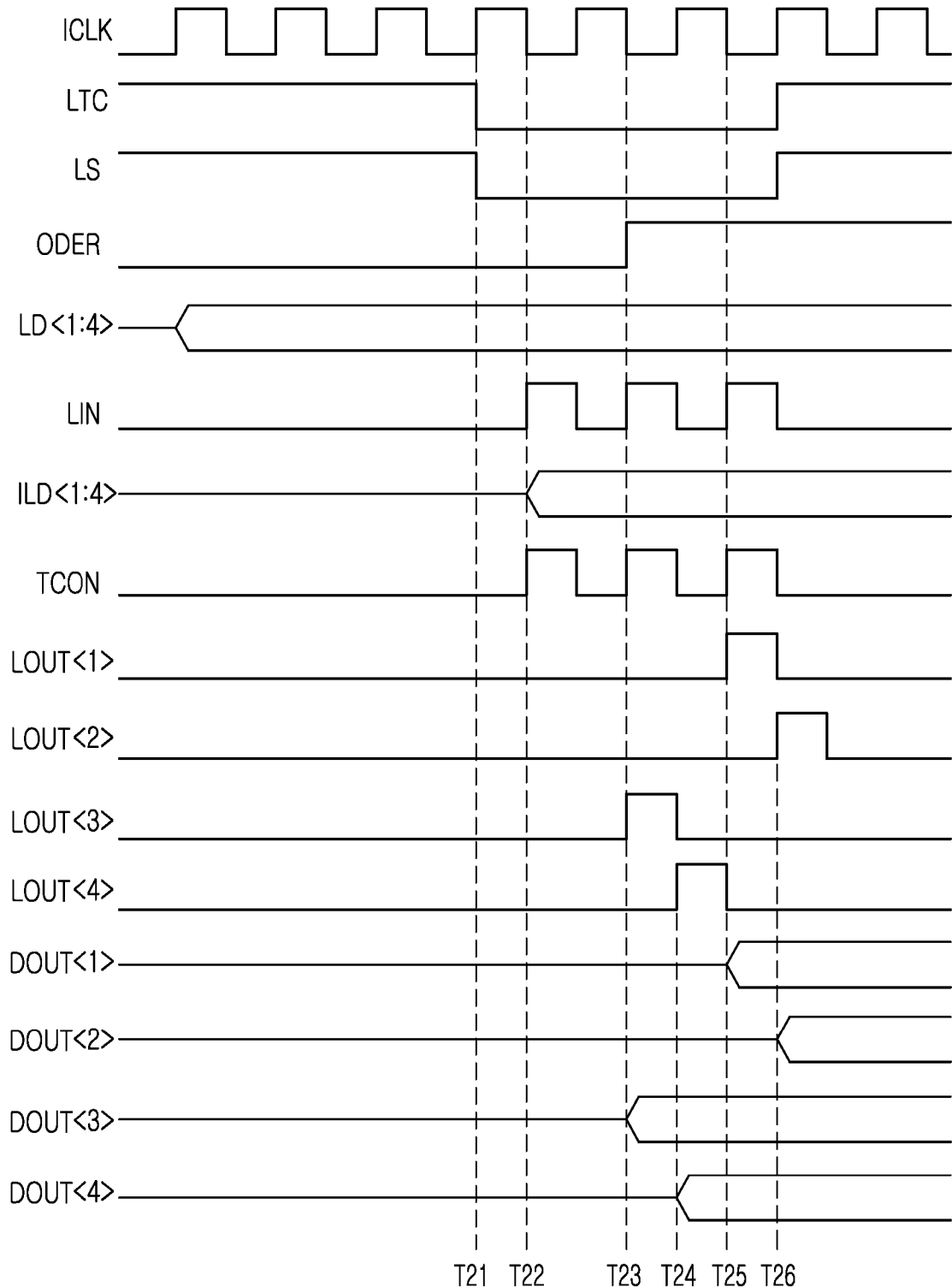

In this case, the read operation shown in FIG. 11 is set as a read operation performed after the read operation shown in FIG. 9 is performed.

At a time T21, the latch signal generation circuit 411 of the latch input signal generation circuit 41 generates the latch signal LS having the logic low level by latching the latency signal LTC in response to the internal clock ICLK having the logic high level.

At a time T22, the second logic circuit 412 of the latch input signal generation circuit 41 generates the latch input signal LIN having the logic high level by inverting and buffering the latch signal LS in response to the internal clock ICLK having the logic low level.

The first latch circuit 611 of the first data output circuit 61 generates the first internal latch data ILD<1> by inverting and buffering the first latch data LD<1> in response to the latch input signal LIN having the logic high level.

The third latch circuit 621 of the second data output circuit 62 generates the second internal latch data ILD<2> by inverting and buffering the second latch data LD<2> in response to the latch input signal LIN having the logic high level.

The fifth latch circuit 631 of the third data output circuit 63 generates the third internal latch data ILD<3> by inverting and buffering the third latch data LD<3> in response to the latch input signal LIN having the logic high level.

The seventh latch circuit 641 of the fourth data output circuit 64 generates the fourth internal latch data ILD<4> by inverting and buffering the fourth latch data LD<4> in response to the latch input signal LIN having the logic high level.

The transfer control signal generation circuit 421 of the latch output signal generation circuit 42 may generate the transfer control signal TCON having the logic high level by inverting and buffering the internal clock ICLK in response to the latency signal LTC having the logic low level.

The third signal transfer circuit 423 of the latch output signal generation circuit 42 receives the order control signal ODER having the logic low level in response to the transfer control signal TCON having the logic high level.

At a time T23, the third signal transfer circuit 423 of the latch output signal generation circuit 42 generates the third latch output signal LOUT<3>, which is enabled to the logic high level, in response to the transfer control signal TCON having the logic high level, because the internal clock ICLK has the logic low level and the order control signal ODER inputted at the time T22 has the logic low level.

The sixth latch circuit 632 of the third data output circuit 63 generates the third output data DOUT<3> by inverting and buffering the third internal latch data ILD<3> in response to the third latch output signal LOUT<3> having the logic high level.

The transfer control signal generation circuit 421 of the latch output signal generation circuit 42 may generate the transfer control signal TCON having the logic high level by inverting and buffering the internal clock ICLK in response to the latency signal LTC having the logic low level.

The second signal transfer circuit 422 of the latch output signal generation circuit 42 receives the order control signal ODER having the logic high level in response to the transfer control signal TCON having the logic high level.

At a time T24, the third signal transfer circuit 423 of the latch output signal generation circuit 42 generates the fourth latch output signal LOUT<4>, which is enabled to the logic high level, during a period in which the internal clock ICLK has the logic high level.

The eighth latch circuit 642 of the fourth data output circuit 64 generates the fourth output data DOUT<4> by inverting and buffering the fourth internal latch data ILD<4> in response to the fourth latch output signal LOUT<4> having the logic high level.

At a time T25, the transfer control signal generation circuit 421 of the latch output signal generation circuit 42 generates the transfer control signal TCON having the logic high level by inverting and buffering the internal clock ICLK in response to the latency signal LTC having the logic low level.

The second signal transfer circuit 422 of the latch output signal generation circuit 42 generates the first latch output signal LOUT<1>, which is enabled to the logic high level, in response to the transfer control signal TCON having the logic high level, because the internal clock ICLK has the logic low level and the order control signal ODER inputted at the time T23 has the logic high level.

The second latch circuit 612 of the first data output circuit 61 generates the first output data DOUT<1> by inverting and buffering the first internal latch data ILD<1> in response to the first latch output signal LOUT<1> having the logic high level.

At a time T26, the second signal transfer circuit 422 of the latch output signal generation circuit 42 generates the second latch output signal LOUT<2>, which is enabled to the logic high level, during a period in which the internal clock ICLK has the logic high level.

The fourth latch circuit 622 of the second data output circuit 62 generates the second output data DOUT<2> by inverting and buffering the second internal latch data ILD<2> in response to the second latch output signal LOUT<2> having the logic high level.

As is apparent from the above descriptions, the semiconductor device 100 in accordance with an embodiment may couple, in series, a pipe latch circuit and a data output circuit which are implemented by pipe latches, and may align and output data by using the pipe latch circuit and the data output circuit which are coupled in series.

Figure 12:
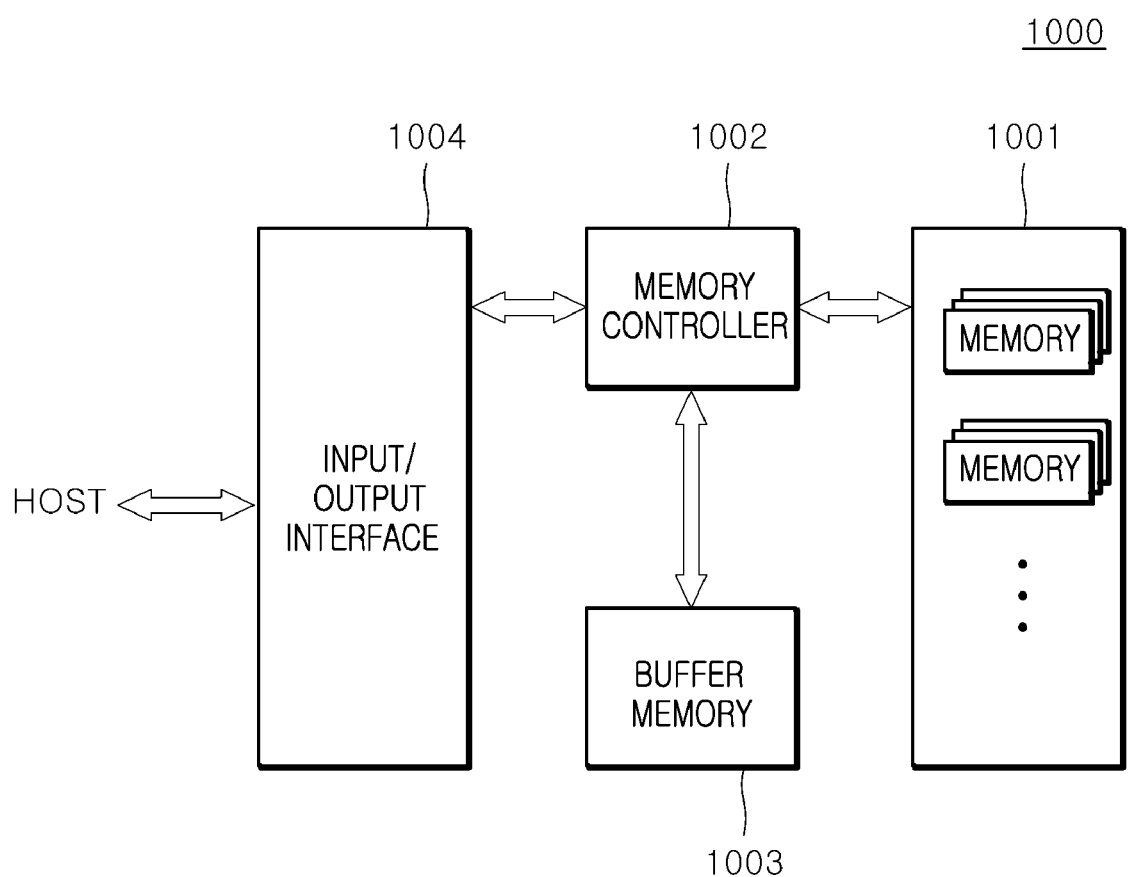
FIG. 12 shows a diagram illustrating a configuration of an electronic system to which the semiconductor device shown in FIGS. 1 to 11 is applied.

The semiconductor device 100 described above with reference to FIGS. 1 to 11 may be applied to an electronic system which includes a memory system, a graphic system, a computing system or a mobile system. For example, referring to FIG. 12, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include the semiconductor device 100 shown in FIG. 1. The data storage 1001 may include a nonvolatile memory capable of retaining and continuously storing data even when a power supply is interrupted. The nonvolatile memory may be realized as a flash memory such as a NOR flash memory and a NAND flash memory, a phase change random access memory (PRAM), a resistive random access memory (RRAM), a spin transfer torque random access memory (STTRAM), or a magnetic random access memory (MRAM).

The memory controller 1002 decodes commands applied through the input/output interface 1004 from an external device (a host), and controls the input/output of data with respect to the data storage 1001 and the buffer memory 1003 according to decoding results. While the memory controller 1002 is illustrated as one block in FIG. 12, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM, and/or an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI, and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood by those skilled in the art that described embodiments represent only a limited number of possible embodiments. Accordingly, the semiconductor device 100 described herein should not be limited based on the described embodiments.

What is claimed is:

1. A semiconductor device comprising:

a latch control circuit configured to generate a latch input signal, which is enabled in response to a latency signal, and configured to generate first, second, third, and fourth latch output signals, which are enabled in response to an order control signal;

a pipe latch circuit configured to latch input data in response to a pipe input signal and configured to output the latched input data as latch data in response to a pipe output signal; and a data output circuit configured to latch the latch data in response to the latch input signal and configured to output the latched latch data as output data in response to the latch output signal, wherein the output data is outputted by performing an alignment operation for the latch data in response to the latch output signal.

2. The semiconductor device according to claim 1, wherein the latency signal is enabled for a predetermined time period during a read operation, and wherein the order control signal has a logic level for determining a data alignment order.

3. The semiconductor device according to claim 1, wherein the latch control circuit comprises:

a latch input signal generation circuit configured to generate the latch input signal, which is enabled in synchronization with an internal clock in response to the latency signal; and a latch output signal generation circuit configured to generate the first, second, third, and fourth latch output signals, which are sequentially enabled in synchronization with the internal clock in response to the order control signal.

4. The semiconductor device according to claim 3, wherein the latch input signal generation circuit comprises:

a latch signal generation circuit configured to latch the latency signal in synchronization with the internal clock and configured to output the latched latency signal as a latch signal; and a logic circuit configured to generate the latch input signal from the latch signal in response to the internal clock.

5. The semiconductor device according to claim 3, wherein the latch output signal generation circuit comprises:

a transfer control signal generation circuit configured to generate a transfer control signal, which is enabled in response to the internal clock and the latency signal;

a first signal transfer circuit configured to be initialized to a voltage level of a ground voltage in synchronization with the internal clock and configured to generate the first latch output signal and the second latch output signal, which are sequentially enabled in synchronization with the internal clock depending on a logic level of the order control signal when the transfer control signal is enabled; and a second signal transfer circuit configured to be initialized to the voltage level of the ground voltage in synchronization with the internal clock and configured to generate the third latch output signal and the fourth latch output signal, which are sequentially enabled in synchronization with the internal clock depending on the logic level of the order control signal when the transfer control signal is enabled.

6. The semiconductor device according to claim 5, wherein the first signal transfer circuit generates the first latch output signal and the second latch output signal, which are enabled when the order control signal has a first logic level, and wherein the second signal transfer circuit generates the third latch output signal and the fourth latch output signal, which are enabled when the order control signal has a second logic level.

7. The semiconductor device according to claim 1, wherein the latch data comprises first, second, third, and fourth latch data, and wherein the output data comprises first, second, third, and fourth output data and wherein the latch output signal comprises first, second, third, and fourth latch output signals, and wherein the data output circuit comprises:

a first data output circuit configured to latch the first latch data in response to the latch input signal, and configured to output the latched first latch data as the first output data in response to the first latch output signal;

a second data output circuit configured to latch the second latch data in response to the latch input signal, configured to and output the latched second latch data as the second output data in response to the second latch output signal;

a third data output circuit configured to latch the third latch data in response to the latch input signal, and configured to output the latched third latch data as the third output data in response to the third latch output signal; and a fourth data output circuit configured to latch the fourth latch data in response to the latch input signal, and configured to output the latched fourth latch data as the fourth output data in response to the fourth latch output signal.

8. The semiconductor device according to claim 7, wherein the first data output circuit comprises:

a first latch circuit configured to latch the first latch data in response to the latch input signal, and configured to output the latched first latch data as first internal latch data; and a second latch circuit configured to latch the first internal latch data in response to the first latch output signal, and configured to output the latched first internal latch data as the first output data.

9. The semiconductor device according to claim 7, wherein the second data output circuit comprises:

a third latch circuit configured to latch the second latch data in response to the latch input signal, and configured to output the latched second latch data as second internal latch data; and a fourth latch circuit configured to latch the second internal latch data in response to the second latch output signal, and configured to output the latched second internal latch data as the second output data.

10. The semiconductor device according to claim 7, wherein the third data output circuit comprises:

a fifth latch circuit configured to latch the third latch data in response to the latch input signal, and configured to output the latched third latch data as third internal latch data; and a sixth latch circuit configured to latch the third internal latch data in response to the third latch output signal, and configured to output the latched third internal latch data as the third output data.

11. The semiconductor device according to claim 7, wherein the fourth data output circuit comprises:

a seventh latch circuit configured to latch the fourth latch data in response to the latch input signal, and configured to output the latched fourth latch data as fourth internal latch data; and an eighth latch circuit configured to latch the fourth internal latch data in response to the fourth latch output signal, and configured to output the latched fourth internal latch data as the fourth output data.

12. A semiconductor device comprising:
a pipe control circuit configured to generate first, second, third, and fourth pipe input signals, which are sequentially enabled in response to a read signal, and configured to generate first, second, third, and fourth pipe output signals, which are sequentially enabled in synchronization with an internal clock in response to a latency signal;
a pipe latch circuit configured to latch first, second, third, and fourth input data in response to the first, second, third, and fourth pipe input signals, and configured to output the latched first, second, third, and fourth input data as first, second, third, and fourth latch data in response to the first, second, third, and fourth pipe output signals; and
a data output circuit configured to latch the first, second, third, and fourth latch data in response to a latch input signal, and configured to output the latched first, second, third, and fourth latch data as first, second, third, and fourth output data in response to first, second, third, and fourth latch output signals.

13. The semiconductor device according to claim 12, wherein the latency signal is enabled for a predetermined time period during a read operation.

14. The semiconductor device according to claim 12, wherein the data output circuit outputs the first, second, third, and fourth output data by performing an alignment operation for the first, second, third, and fourth latch data in response to the first, second, third, and fourth latch output signals.

15. The semiconductor device according to claim 12, wherein the pipe control circuit comprises:
a pipe input signal generation circuit configured to generate the first, second, third, and fourth pipe input signals, which are sequentially enabled in response to the read signal; and
a pipe output signal generation circuit configured to generate the first, second, third, and fourth pipe output signals, which are sequentially enabled in synchronization with the internal clock in response to the latency signal.

16. The semiconductor device according to claim 15, wherein the pipe input signal generation circuit comprises:
a pulse signal generation circuit configured to generate a pulse signal, which comprises a pulse generated in response to the read signal;
a transfer signal generation circuit configured to generate first, second, third, and fourth transfer signals, which are sequentially enabled in response to the pulse signal; and
a logic circuit configured to output the first, second, third, and fourth pipe input signals by inverting and buffering the first, second, third, and fourth transfer signals in response to the pulse signal.

17. The semiconductor device according to claim 16, wherein the first, second, third, and fourth transfer signals are initialized to have a first set combination, and wherein the first set combination corresponds to the first, second, and third transfer signals having first logic levels and the fourth transfer signal having a second logic level.

18. The semiconductor device according to claim 15, wherein the pipe output signal generation circuit comprises:
a control signal generation circuit configured to latch the latency signal in synchronization with the internal clock, and configured to output the latched latency signal as a control signal; and
a signal transfer circuit configured to generate the first, second, third, and fourth pipe output signals, which are sequentially enabled in response to the control signal.

19. The semiconductor device according to claim 18, wherein the first, second, third, and fourth pipe output signals are initialized to have a second set combination, and wherein the second set combination corresponds to the first pipe output signal having a second logic level and the second, third, and fourth pipe output signals having first logic levels.

20. The semiconductor device according to claim 12, wherein the data output circuit comprises:
a first data output circuit configured to latch the first latch data in response to the latch input signal, and configured to output the latched first latch data as the first output data in response to the first latch output signal;
a second data output circuit configured to latch the second latch data in response to the latch input signal, and configured to output the latched second latch data as the second output data in response to the second latch output signal;
a third data output circuit configured to latch the third latch data in response to the latch input signal, and configured to output the latched third latch data as the third output data in response to the third latch output signal; and
a fourth data output circuit configured to latch the fourth latch data in response to the latch input signal, and configured to output the latched fourth latch data as the fourth output data in response to the fourth latch output signal.

21. The semiconductor device according to claim 12, further comprising:
a latch control circuit configured to generate the latch input signal, which is enabled in response to the latency signal and configured to generate the first, second, third, and fourth latch output signals, which are enabled in response to an order control signal.

22. The semiconductor device according to claim 21, wherein the latch control circuit comprises:
a latch input signal generation circuit configured to generate the latch input signal, which is enabled in synchronization with the internal clock in response to the latency signal; and
a latch output signal generation circuit configured to generate the first, second, third, and fourth latch output signals, which are sequentially enabled in synchronization with the internal clock in response to the order control signal.

23. The semiconductor device according to claim 22, wherein the latch input signal generation circuit comprises:
a latch signal generation circuit configured to latch the latency signal in synchronization with the internal clock, and configured to output the latched latency signal as a latch signal; and
a logic circuit configured to generate the latch input signal from the latch signal in response to the internal clock.

24. The semiconductor device according to claim 22, wherein the latch output signal generation circuit comprises:
a transfer control signal generation circuit configured to generate a transfer control signal, which is enabled in response to the internal clock and the latency signal;

a first signal transfer circuit configured to be initialized to a voltage level of a ground voltage in synchronization with the internal clock and configured to generate the first latch output signal and the second latch output signal, which are sequentially enabled in synchronization with the internal clock depending on a logic level of the order control signal when the transfer control signal is enabled; and a second signal transfer circuit configured to be initialized to the voltage level of the ground voltage in synchronization with the internal clock and configured to generate the third latch output signal and the fourth latch output signal which are sequentially enabled in synchronization with the internal clock depending on the logic level of the order control signal when the transfer control signal is enabled.

25. The semiconductor device according to claim 24, wherein the first signal transfer circuit generates the first latch output signal and the second latch output signal, which are enabled when the order control signal has a first logic level, and wherein the second signal transfer circuit generates the third latch output signal and the fourth latch output signal, which are enabled when the order control signal has a second logic level.

\* \* \* \* \*